United States Patent
Chu et al.

(10) Patent No.: US 11,769,820 B2
(45) Date of Patent: Sep. 26, 2023

(54) METHODS OF MANUFACTURING A FINFET BY FORMING A HOLLOW AREA IN THE EPITAXIAL SOURCE/DRAIN REGION

(71) Applicant: Taiwan Semiconductor Manufacturing Co., Ltd., Hsinchu (TW)

(72) Inventors: Feng-Ching Chu, Pingtung County (TW); Wei-Yang Lee, Taipei (TW); Feng-Cheng Yang, Hsinchu County (TW); Yen-Ming Chen, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 29 days.

(21) Appl. No.: 16/949,446

(22) Filed: Jan. 11, 2021

(65) Prior Publication Data
US 2021/0273079 A1   Sep. 2, 2021

Related U.S. Application Data

(60) Provisional application No. 62/982,556, filed on Feb. 27, 2020.

(51) Int. Cl.
*H01L 29/66* (2006.01)
*H01L 21/8234* (2006.01)
(Continued)

(52) U.S. Cl.
CPC ........... *H01L 29/66795* (2013.01); *H01L 21/823418* (2013.01); *H01L 21/823431* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 21/823418; H01L 21/823814; H01L 29/0847; H01L 29/7848; H01L 29/66636; H01L 29/0653; H01L 21/764; H01L 29/78696; H01L 29/42392; H01L 21/823425
See application file for complete search history.

(56) References Cited

U.S. PATENT DOCUMENTS 8,836,016 B2   9/2014   Wu et al.
8,841,701 B2   9/2014   Lin et al.
(Continued)

*Primary Examiner* — Younes Boulghassoul
(74) *Attorney, Agent, or Firm* — HAYNES AND BOONE, LLP

(57) ABSTRACT

Methods and devices formed thereof that include a fin structure extending from a substrate and a gate structure is formed over the fin structure. An epitaxial feature is formed over the fin structure adjacent the gate structure. The epitaxial feature can include a hollow region (or dielectric filled hollow region) in the epitaxial source/drain region. A selective etching process is performed to remove at least a portion of an epitaxial region having a second dopant type to form the hollow area between the first epitaxial portion and the third epitaxial portion.

20 Claims, 13 Drawing Sheets

(51) Int. Cl.
*H01L 29/78* (2006.01)
*H01L 29/08* (2006.01)
*H01L 29/06* (2006.01)

(52) U.S. Cl.
CPC ...... *H01L 29/0653* (2013.01); *H01L 29/0847* (2013.01); *H01L 29/785* (2013.01); *H01L 29/7848* (2013.01); *H01L 29/7851* (2013.01); *H01L 29/66545* (2013.01)

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 10,256,158 B1 * | 4/2019 | Frougier | H01L 29/161 |
| 10,879,308 B1 * | 12/2020 | Ando | G11C 13/004 |
| 2018/0151703 A1 * | 5/2018 | Lin | H01L 21/461 |
| 2018/0190810 A1 * | 7/2018 | Li | H01L 29/0847 |
| 2019/0131396 A1 * | 5/2019 | Zhang | H01L 21/02236 |
| 2019/0164835 A1 * | 5/2019 | Lu | H01L 21/823821 |
| 2019/0165143 A1 * | 5/2019 | More | H01L 29/7833 |
| 2019/0312117 A1 * | 10/2019 | Qi | H01L 29/665 |
| 2019/0341448 A1 * | 11/2019 | Bourjot | H01L 29/775 |
| 2020/0118892 A1 * | 4/2020 | Cheng | H01L 27/1211 |
| 2020/0212038 A1 * | 7/2020 | Rachmady | H01L 27/092 |
| 2020/0402984 A1 * | 12/2020 | Reznicek | H01L 29/66545 |
| 2021/0210349 A1 * | 7/2021 | Xie | H01L 21/76224 |

* cited by examiner

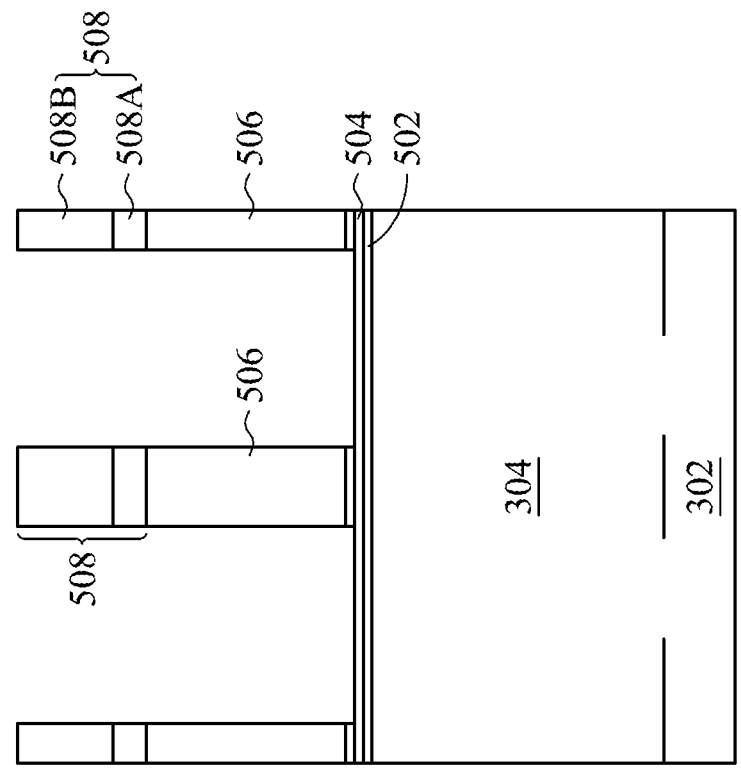
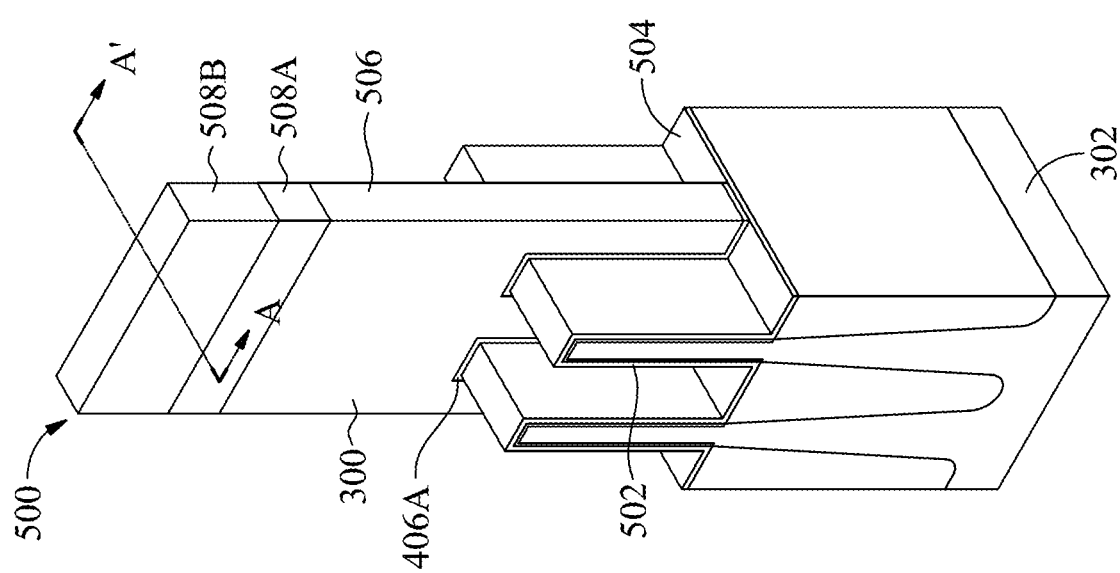
Fig. 5A
Fig. 5B

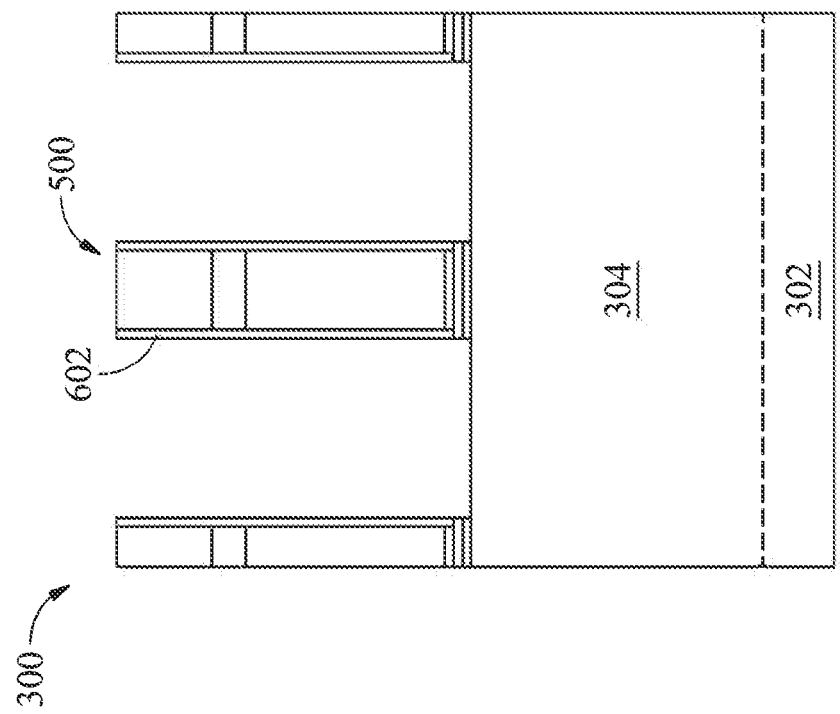
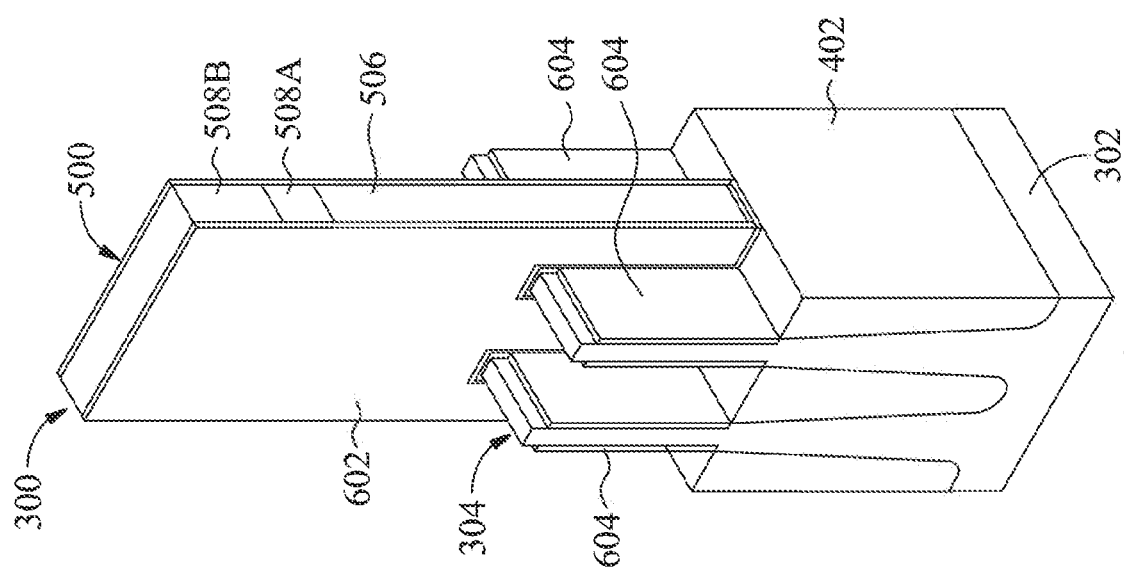
Fig. 6B
Fig. 6A

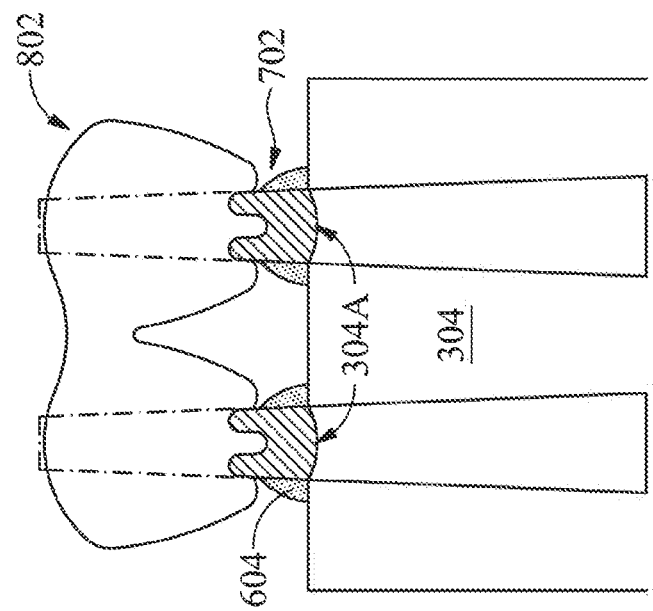
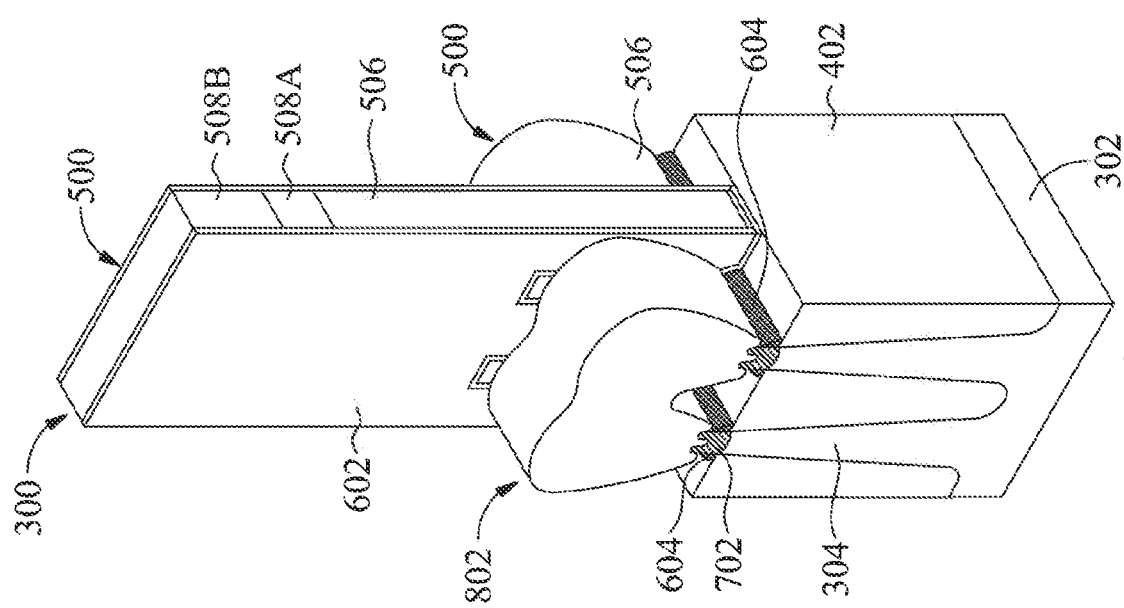

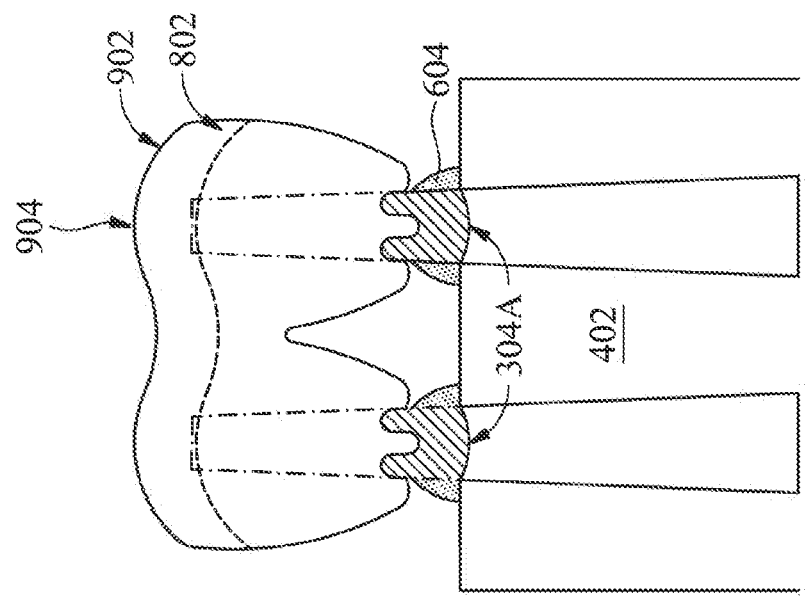
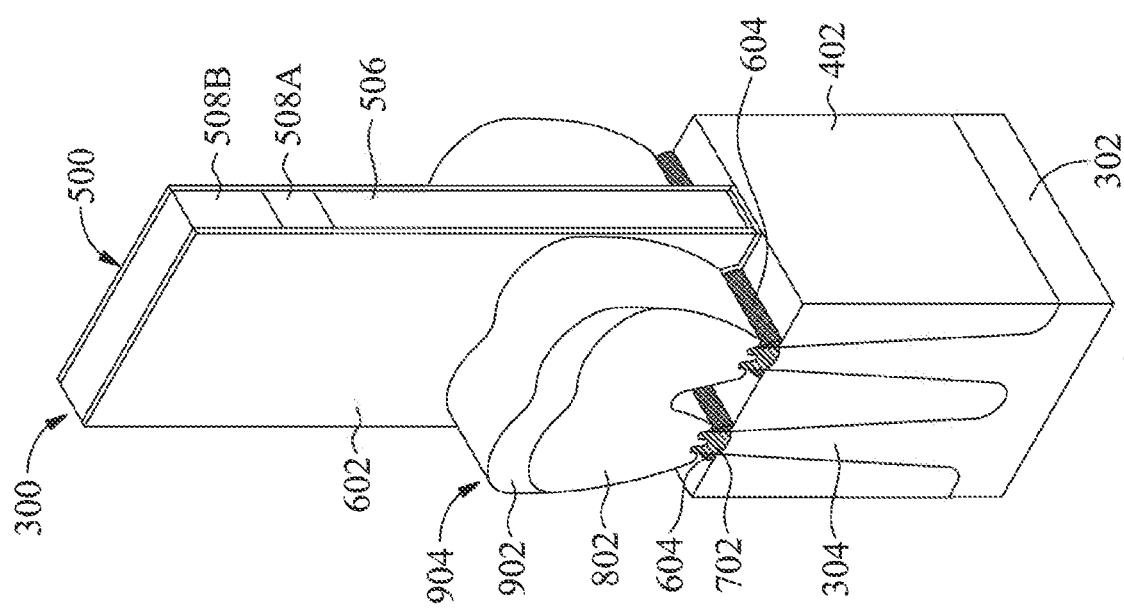

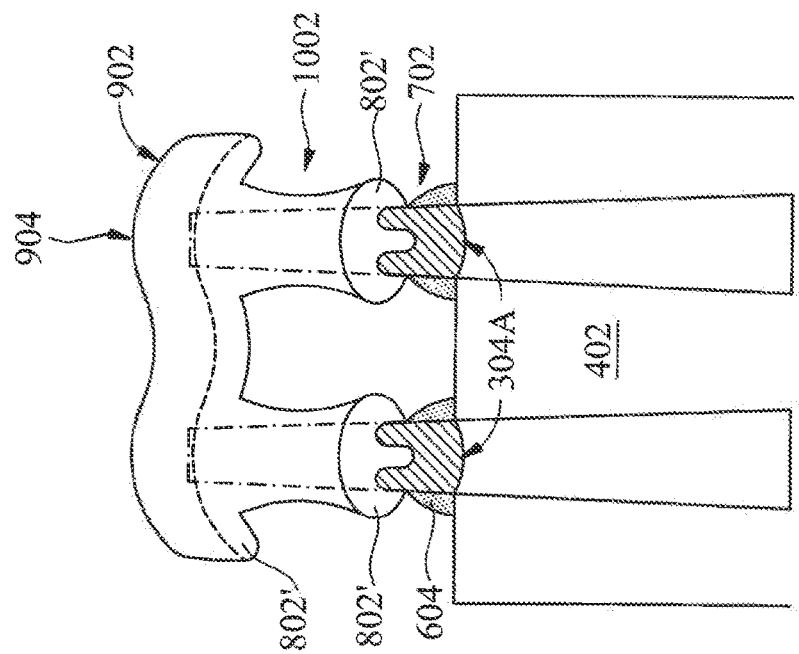
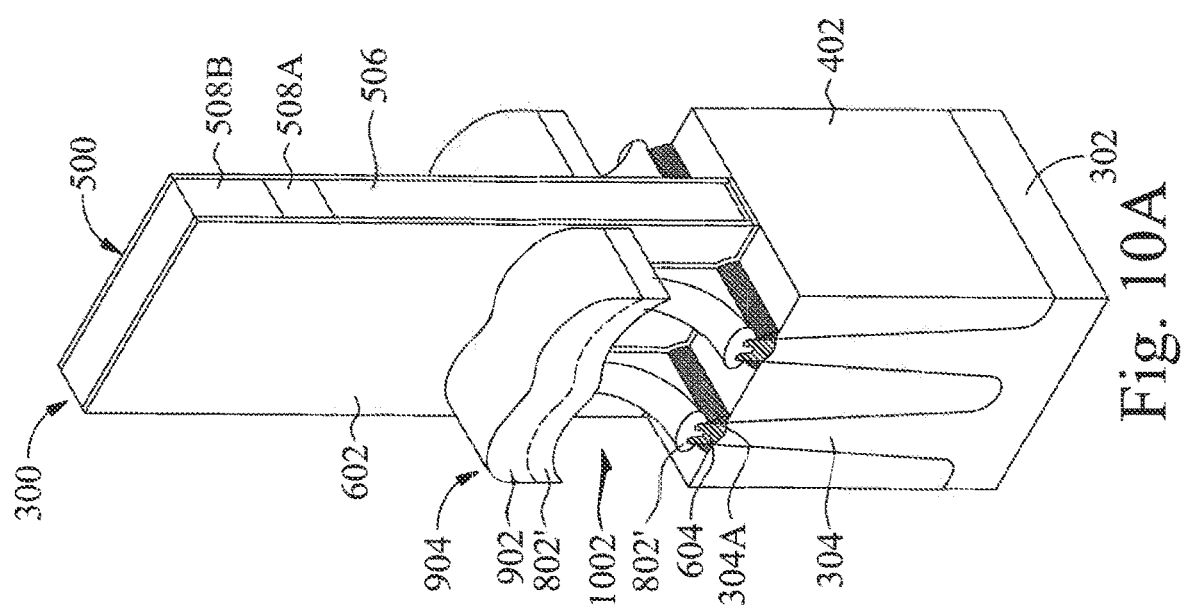

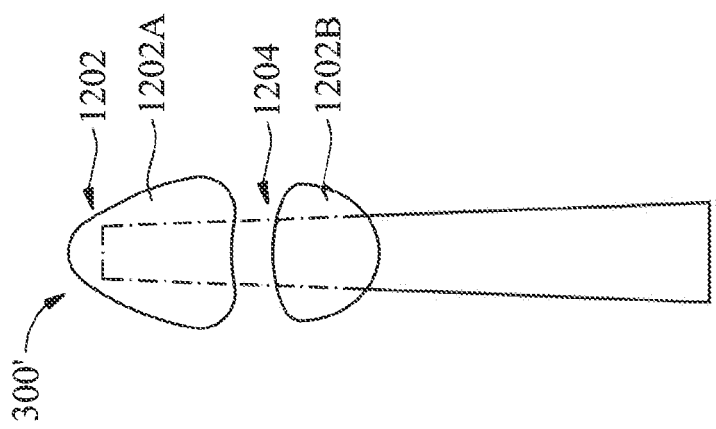
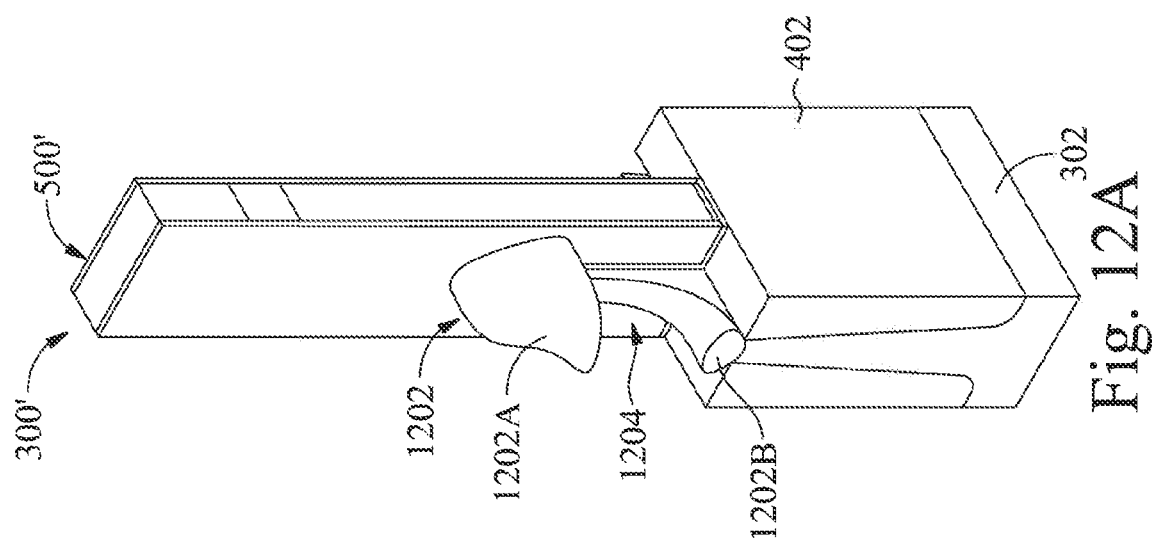

METHODS OF MANUFACTURING A FINFET BY FORMING A HOLLOW AREA IN THE EPITAXIAL SOURCE/DRAIN REGION

PRIORITY DATA

This is a non-provisional application of and claims benefit of U.S. Provisional Patent Application Ser. No. 62/982,556, filed Feb. 27, 2020, the entire disclosure of which is incorporated herein by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs.

In various conventional processes, source/drain regions can be epitaxially grown for the FinFETs. In some existing implementations, devices can suffer from undesirably high capacitance including between each of source/drain and gate. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5A, 6A, 7A, 8A, 9A, 10A, 11, and 12A are isometric views of an embodiment of a device 300 according to aspects of the method of FIGS. 1 and 2;

FIGS. 5B, 6B, 7B, 8B, 9B, 10B, 10D, 12B, and 12D are cross-section views, corresponding to respective isometric views listed above, of an embodiment of the device 300 according to aspects of the method of FIGS. 1 and 2.

DETAILED DESCRIPTION

Figure 1:
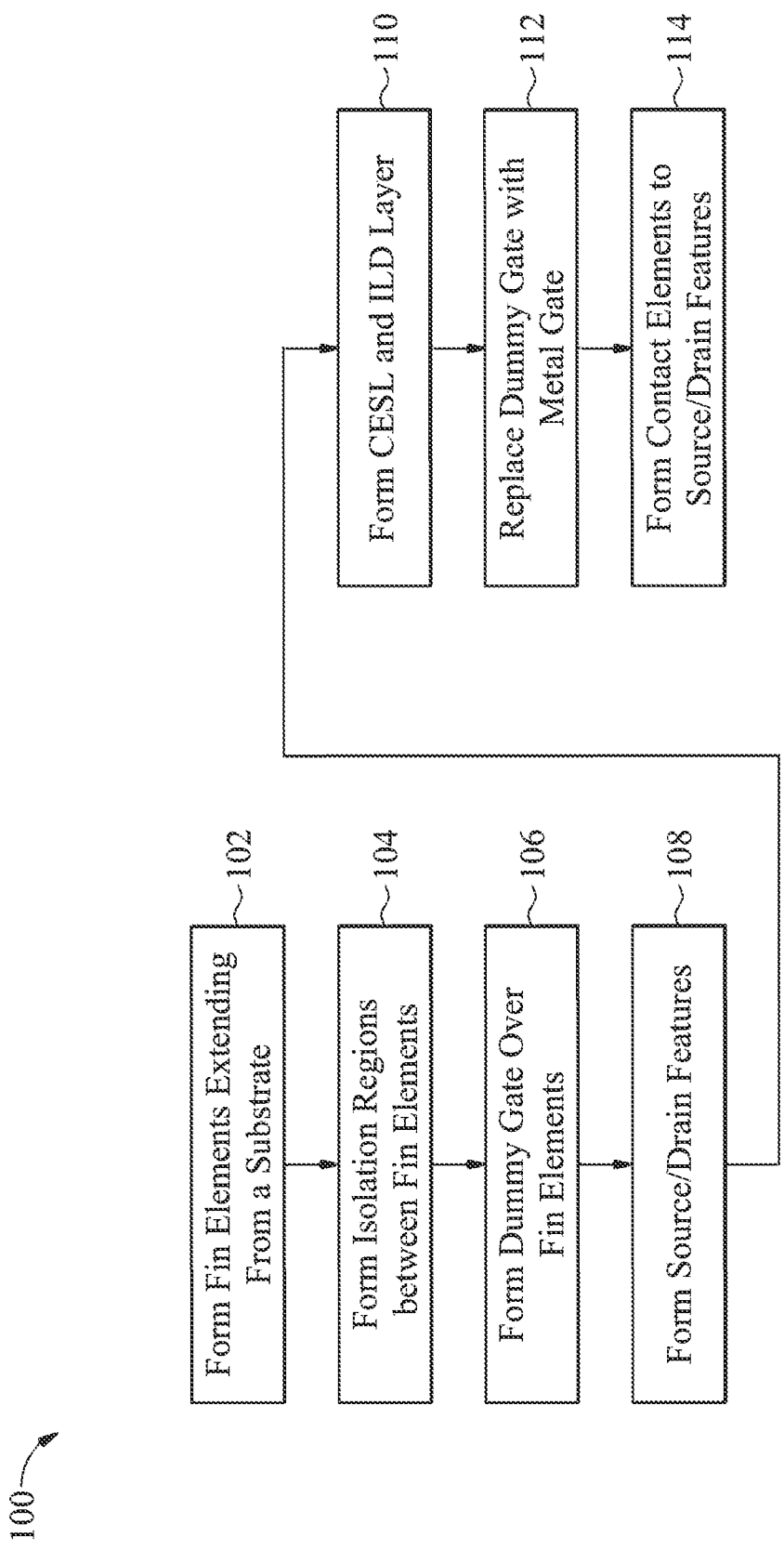
FIG. 1 is a flow chart of a method of fabricating a FinFET device or portion thereof according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

The present disclosure is generally related to semiconductor devices and fabrication methods, and more particularly to the formation of devices (e.g., FinFETs) fabricated using epitaxial growth processes for providing a source/drain region, as described in more detail below. However, one of skill in the art would recognize the application to other device types, as discussed above, and also other features of said devices.

Embodiments of the present disclosure offer advantages over the existing art, though it is understood that other embodiments may offer different advantages, not all advantages are necessarily discussed herein, and no particular advantage is required for all embodiments. For example, various embodiments provide a method and related structure for improving capacitance of a FinFET. The capacitance between the gate structure and the source/drain regions may be reduced. A tunable location and size of a hollow region or void within an epitaxial source or drain region can be designed to provide said capacitance reduction. The hollow region or void may be filled with a dielectric material, e.g., air or insulating materials (e.g., interlayer dielectric (ILD) or contact etch stop layer (CESL)). For example, the capacitance is governed by equation:

$$C=Q/V=\varepsilon A/d_0$$

for permittivity ε, the permittivity of semiconductor materials in the source/drain region (such as SiP) is greater than that of dielectrics. For example, SiN (CESL)>oxide (ILD)>air. Air has a permittivity of approximately 1. Methods and devices implementing in some embodiments the capacitance reduction by a hollow region within the source/drain are described herein.

Figure 11:
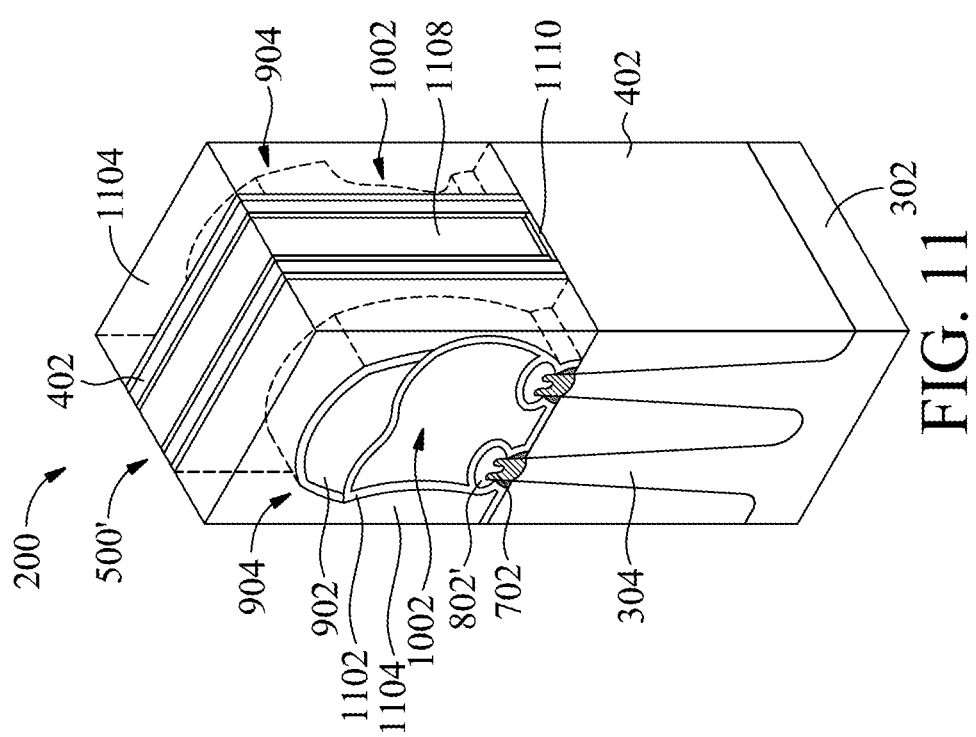
Figure 12D:
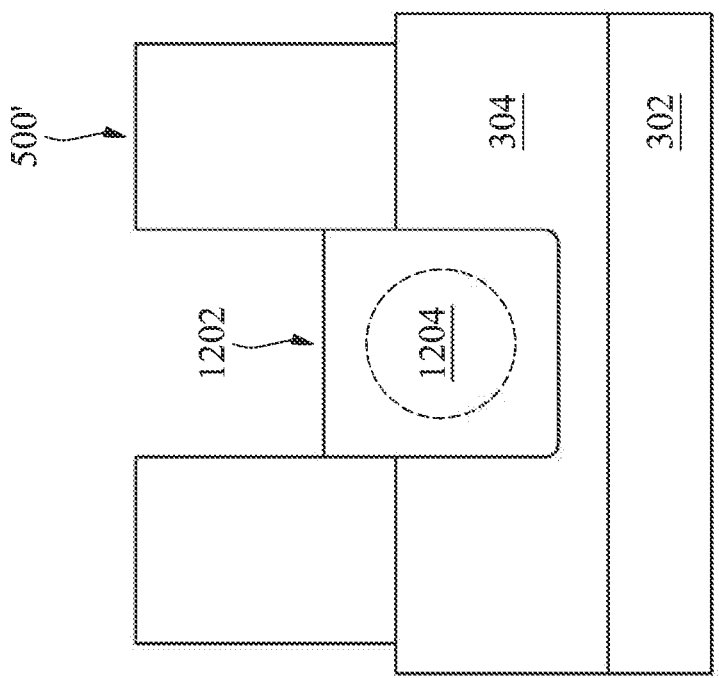
Figure 12C:
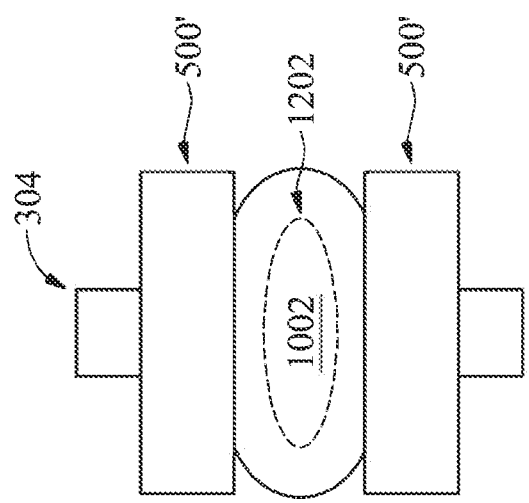

Referring now to FIG. 1, illustrated therein is a method 100 for fabricating a device including an epitaxial layer, in accordance with some embodiments. It is understood that the method 100 includes steps having features of a complementary metal-oxide-semiconductor (CMOS) technology process flow and thus, are only described briefly herein. Additional steps may be performed before, after, and/or during the method 100. FIGS. 3, 4, 5A, 6A, 7A, 8A, 9A, 10A, 11, and 12A provide isometric views of an embodiment of a semiconductor device 300 (or 300') according to various stages of the method 100 of FIG. 1. FIGS. 5B, 6B, 7B, 8B, 9B, 10B, 10D and 12B, 12D are cross-section views (e.g., along an exemplary plane A-A', as shown in FIG. 5A), corresponding to respective isometric views listed above, of an embodiment of the semiconductor device 300 (or 300') according to various stages of the method 100 of FIG. 1. FIG. 12C illustrates a top view a region of the device 300 of FIG. 12A, according to some embodiments. FIGS. 12A/12B/12C/12D illustrates an embodiment of the semiconductor device 300' that may also be fabricated according to various stages of the method 100 of FIG. 1. The semiconductor device 300' is substantially similar to the semiconductor device 300 and the description of the semiconductor device 300 applies equally to the semiconductor device 300'.

Further, the semiconductor device 300 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 300 includes a plurality of semiconductor devices (e.g., transistors), including PFETs, NFETs, etc., which may be interconnected. Moreover, it is noted that the process steps of method 100, including any descriptions given with reference to the figures are merely exemplary and are not intended to be limiting beyond what is specifically recited in the claims that follow.

In an embodiment, the device 300 illustrated in the exemplary figures is an n-type FET (nFET). The nFET may be suitable for use in an SRAM application or other integrated circuit. The device 300 may be a two-fin structure, such that a single gate structure interfaces two fins and the source/drain regions grown on said fins merge. In other embodiments, the device 300' may be a single fin structure, such that a gate traverses the fin and a source/drain is grown on a single fin and does not merge to another fin, for example, as illustrated by FIG. 12A/12B/12C/12D.

The method 100 begins at block 102 where fin elements, used for subsequent FinFET formation, are formed extending from a substrate. With reference to the example of FIG. 3, in an embodiment of block 102, a plurality of fin structures 304 extending from a substrate 302 are formed. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include one or more epitaxial layers (epi-layers), may be strained for performance enhancement, may include a silicon-on-insulator (SOI) structure, and/or have other suitable enhancement features.

In some embodiments, an anti-punch through (APT) implant may be performed (e.g., into the substrate 302) prior to formation of the fin structures 304. In some cases, also prior to formation of the fin structures 304, a hard mask (HM) layer(s) 306 may be formed over the substrate 302. The HM layer may include an oxide layer portion 306A (e.g., a pad oxide layer that may include $SiO_2$) and a nitride layer portion 306B (e.g., a pad nitride layer that may include $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique. By way of example, the oxide layer of the HM layer, 306A, may have a thickness of between approximately 5 nm and approximately 40 nm. In some embodiments, the nitride layer of the HM layer, 306B, may have a thickness of between approximately 20 nm and approximately 160 nm.

The fins 304, like the substrate 302, may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 304 may be fabricated using suitable processes including photolithography and etch processes. The photolithography process may include forming a photoresist layer over the substrate 302 (e.g., over an HM layer formed over the substrate 302), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 302, and layers formed thereupon, while an etch process forms trenches 308 in unprotected regions through the HM layer and into the substrate 302, thereby leaving the plurality of extending fin structures 304 with HM layer portion 306 overlying each fin 304. The trenches 308 may be etched using a dry etch (e.g., reactive ion etching), a wet etch, and/or other suitable processes. Numerous other embodiments of methods to form the fins 304 on the substrate 302 may also be used.

The method 100 then proceeds to block 104 where isolation regions are formed between fin elements. With reference to the example of FIG. 4, in an embodiment of block 104, a plurality of isolation structures 402 are formed. In some embodiments, the plurality of isolation structures 402 may include a plurality of shallow trench isolation (STI) features including a dielectric material. By way of example, the dielectric material is first deposited over the substrate 302, filling the trenches 308 with the dielectric material. In some embodiments, the dielectric material may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, or other suitable process. In some embodiments, after deposition of the dielectric material, the device 300 may be annealed to improve the quality of the dielectric material. In some embodiments, a field oxide, a LOCOS feature, and/or other suitable isolation features may additionally or alternatively be implemented on and/or within the substrate. However, other embodiments are possible. For example, in some embodiments, the dielectric material (and subsequently formed isolation structures 402) may include a multi-layer structure, for example, having one or more liner layers. After deposition of the dielectric material, the deposited dielectric material is thinned and planarized, for example by a CMP process. In some embodiments, such a CMP process may be used to remove excess dielectric material, planarize a top surface of the device 300, and form isolation regions (e.g., which are subsequently recessed to form the isolation regions 402, as described below).

In some embodiments, the CMP process used to planarize the top surface of the device 300 and form the isolation regions (e.g., prior to recessing the isolation regions) may also serve to remove the HM layer portion 306 or portions thereof from each of the plurality of fin structures 304. In some embodiments, removal of the HM layer portion 306 includes removal of the oxide layer portion 306A and the nitride layer portion 306B in concurrent or separate processes (e.g., CMP). Removal of the HM layer portion 306, including the oxide layer portion 306A and the nitride layer portion 306B, may alternately be performed by using a suitable etching process or processes (e.g., dry or wet etching). Whether by using a CMP process and/or an etching process, upon removal of the HM layer portion 306 from the top of each of the fin structures 304, provides for a top surface of the fin structures 304 (e.g., semiconductor material) to be exposed.

Figure 4:
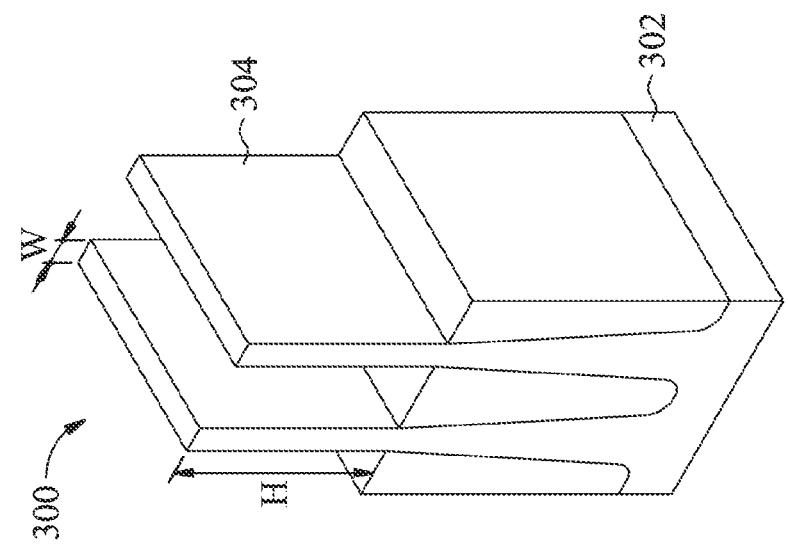
Figure 3:
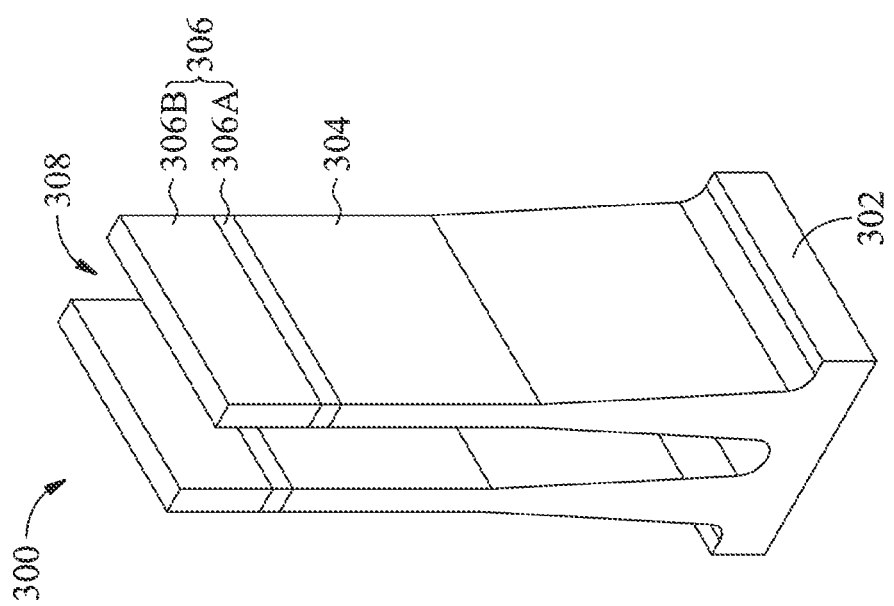

After the CMP process to remove the excess dielectric material and planarize the top surface of the device 300, the isolation regions around the fin structures 304 are recessed to laterally expose an upper portion of the fin structures 304 and form the isolation regions 402 as illustrated in FIG. 4. In various examples, the isolation structures 402 are configured to isolate fin active regions. In some embodiments, the recessing process may include a dry etching process, a wet etching process, and/or a combination thereof. In various embodiments, a recessing depth is controlled (e.g., by controlling an etching time) so as to result in a desired height 'H' of the exposed upper portion of the fin elements 304. In some embodiments, the height 'H' may be between approximately 30 nm-60 nm. In some cases, a fin width 'W' may be between approximately 4 nm-10 nm.

The method 100 then proceeds to block 106 where a gate structure is formed over the fin elements. In an embodiment, the gate structure is a dummy gate. In an embodiment, the formation of the gate structure includes forming a gate dielectric layer(s) and gate electrode layer(s), one or more of said layers being sacrificial. With reference to the example of FIGS. 5A and 5B, in an embodiment of block 106, a gate structure 500 is formed. In some embodiments, the gate structure 500 is sacrificial, or in other words, is a dummy gate that is subsequently replaced by a functional gate (e.g., 500' discussed below). The gate structure 500 may include an interfacial layer 502, which is formed over the exposed upper portion of the fin structures 304, a gate dielectric layer 504 is formed over the interfacial layer 502, and an electrode layer 506 is formed over the gate dielectric layer 504. In some embodiments, one or more of the interfacial layer 502, the gate dielectric layer 504, and the electrode layer 506 are formed conformally over the fin structures 304, including within trenches between adjacent fin structures 304 and one or more of said layers are subsequently patterned.

In some embodiments, the interfacial layer 502 may include a dielectric material such as silicon oxide ($SiO_2$), HfSiO, or silicon oxynitride (SiON). The interfacial layer 502 may be formed by chemical oxidation, thermal oxidation, atomic layer deposition (ALD), chemical vapor deposition (CVD), and/or other suitable method. In various examples, a thickness of the interfacial layer 502 may be around 0.5-3 nm. In some embodiments, the interfacial layer 502 is not formed over the isolation structure 402.

In an embodiment, the gate dielectric layer 504 includes silicon oxide. Other compositions are also possible including high-k dielectric materials such as hafnium oxide ($HfO_2$), HfZrO, $TiO_2$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layer 504 may be formed by chemical oxidation, thermal oxidation, atomic layer deposition (ALD), chemical vapor deposition (CVD), ALD, physical vapor deposition (PVD), and/or other suitable methods. In various examples, a thickness of the gate dielectric layer 504 may be around 1-5 nm.

In some embodiments, the electrode layer 506 may include polycrystalline silicon (polysilicon). Alternatively, in some embodiments, a metal gate electrode layer may be formed including Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. As discussed above, in some cases, the electrode layer 506 (like the gate dielectric layer 504 and possibly the interfacial layer 502) is removed in a subsequent replacement gate process, as discussed herein. In other embodiments, the electrode layer 506 is retained and may provide an N-type or P-type work function, for example, depending on whether an N-type or P-type FinFET is being formed. In various embodiments, the electrode layer 506 may be formed by ALD, PVD, CVD, e-beam evaporation, or other suitable process. Multiple layers may be formed for the electrode layer 506 and/or below the electrode layer 506 (see, e.g., FIG. 5A, 5B unlabeled layer).

In some examples, a hard mask 508 may be formed over the gate electrode layer 506, where the hard mask 508 includes an oxide layer 508A and a nitride layer 508B formed over the oxide layer 508A. In some examples, deposition of the hard mask 508 may be accomplished using CVD, PVD, ALD, thermal oxidation, or other suitable deposition techniques, or a combination thereof. In some embodiments, the oxide layer 508A includes a pad oxide layer that may include $SiO_2$. In some embodiments, the nitride layer 508B includes a pad nitride layer that may include $Si_3N_4$, silicon oxynitride or silicon carbide.

Block 106 includes the deposition of materials as discussed above, and the subsequent patterning of the layers.

With reference to the example of FIGS. 5A/5B, the hard mask 508 and the gate electrode layer 506 are patterned to form a gate structure 500 (e.g., using photolithography and etching processes). In some embodiments, the photolithography process may include photoresist coating (e.g., over the hard mask 508), soft baking, mask aligning, exposure, post-exposure baking, photoresist developing, rinsing, drying (e.g., spin-drying and/or hard baking), and/or other suitable lithography techniques, and/or combinations thereof. The photolithography process may provide a patterned photoresist layer which serves as a masking element for the subsequent etching process. The masking element may be used to protect some regions of the device 300, while an etching process (e.g., a dry etch, a wet etch, or combination thereof) etches through unprotected regions of the device 300 including unprotected regions of the hard mask 508 and the electrode layer 506, thereby leaving the (dummy) gate structure 500. In some embodiments, the dielectric layers 502 and/or 504 may also be patterned. In alternative embodiments, the dielectric layers 502 and/or 504 are not patterned.

The method 100 at block 106 may include formation of one or more spacer layers referred to herein as part of the gate structure 500. The spacer layers may also be formed on a sidewall of the fin structures 304. With reference to the example of FIGS. 6A/6B, in an embodiment of block 106, a spacer layer 602 is formed over the substrate 302 including over the gate structure 500. Fin spacers 604 are formed on the fin structures 304. In some cases, the spacer layer 602 may be referred to as an offset spacer. In some embodiments, the spacer layer 602 and/or 604 may include a dielectric material such as silicon oxide, silicon nitride, silicon carbide, silicon oxynitride, SiOC, SiOCN, a low-K dielectric material, or combinations thereof. The spacer layer 602 and/or 604 may be formed by chemical oxidation, thermal oxidation, ALD, CVD, and/or other suitable method. In various examples, a thickness of the spacer layer 602 and/or 604 may be around 1-8 nm. In some embodiments after conformal deposition, the spacer layer material, high-K gate dielectric layer, and/or interfacial layer are etched-back (or pulled-back) to expose the fin 304 in a source/drain region adjacent the gate structure 500.

Figure 2:
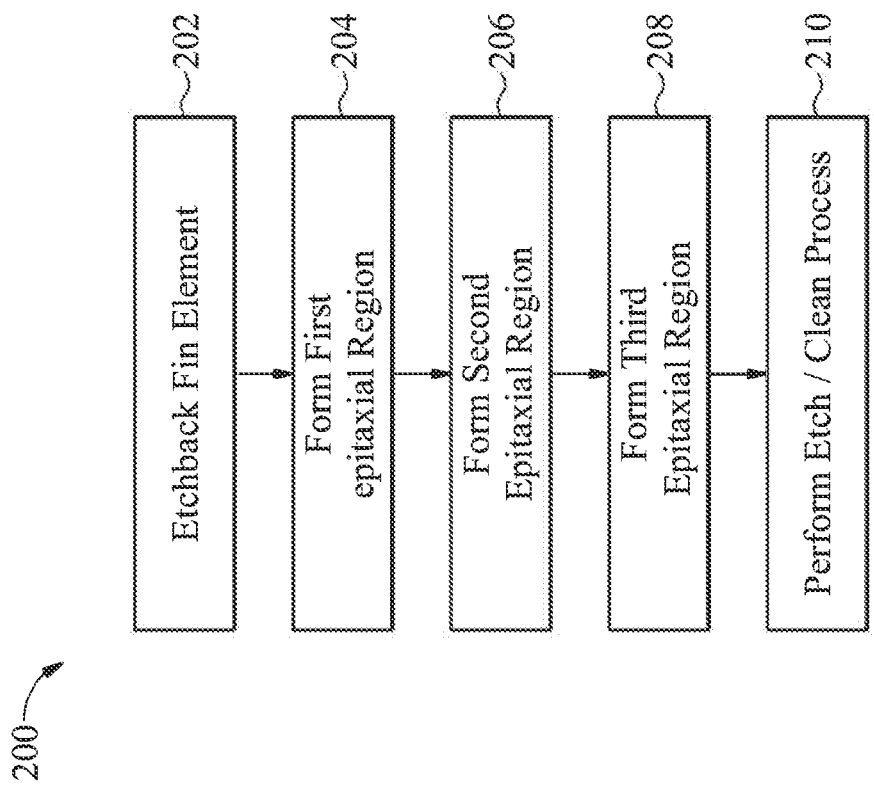
FIG. 2 is a flow chart of a method of forming an epitaxial feature that may be used in conjunction with an embodiment of the method of FIG. 1 according to one or more aspects of the present disclosure.

The method 100 then proceeds to block 108 where source/drain features are formed. The source/drain features are formed in a source/drain region of the fin, which is adjacent the gate structure covering the channel region of the fin. The source/drain features may be formed by epitaxially growth. One example method of forming an epitaxial feature suitable for block 108 to form an epitaxial feature suitable for use as a source/drain is illustrated in the method 200 of FIG. 2. FIG. 2 is exemplary method 200 including a forming a three-stage epitaxial material, in some embodiments by performing a three-stage epitaxial growth process. However, in some embodiments, one or more of the stages may be omitted or additional stages may be added to the epitaxially growth processes of the method 200 of FIG. 2.

In an embodiment, the method 200 begins at block 202 where the fin element in the source/drain region is etched back. In some embodiments, block 202 is omitted. For example, a seed area for the subsequent epitaxial growth described below is provided at a top surface of the fin element, without etch back. Referring to the example of FIG. 7A/7B, the fin structure 304 is selectively etched back to provide a recessed top surface 304A. The recessed top surface 304A provides a seed (e.g., a surface on which epitaxial material nucleates) for subsequent epitaxial growth described below. It is noted that the depicted recessed top surface 304A is substantially adjacent the top surface of the isolation structure 402. However, in other embodiments, the recessed top surface 304A may be below a top surface of the isolation structure 402. In yet other embodiments, the recessed top surface 304A may be above a top surface of the isolation structure 402. In an embodiment, spacer 604 remain (in whole or in part) above the isolation features adjacent the fin structure 304.

The etching back process of the fin structure 304 may be performed by a wet etching process, a dry etching process or combinations thereof. It is noted that an outline of the fin 304, removed in the source/drain region for some embodiments that include etching back, is provided for ease of reference as a dotted line in FIG. 7B. The etching back process of the fin structure 304 may be selective to the fin material leaving the surrounding dielectrics substantially unetched.

The method 200 then proceeds to block 204 to form a first portion of multi-region epitaxial feature providing a source/drain of the device. In an embodiment, block 204 initiate a multi-stage process that forms this epitaxial feature that can provide the source/drain feature. In an embodiment, a first epitaxial layer, a second epitaxial layer, and a third epitaxial layer are formed by a three-stage process, and together provide the epitaxial feature. In an embodiment, block 204 forms a first epitaxial layer on a seed region of the exposed surfaces of the fin structure. In the case of etch back of block 202 being performed, the seed surface includes the recessed top surface. In the case of no or limited etch back, the seed surface may include the top surfaces and sidewall surfaces of the S/D regions of fin structures 304. In other words, the first epitaxial layer wraps around S/D regions of fins 304.

The multi-region epitaxial feature on completion of the source/drain feature provides a first region on the seed area of the fin and adjacent the channel, a second region having a hollow region, and a third region above the second region. In an embodiment, the first region includes no dopant or a first dopant type, the second region includes a second dopant type and a first dopant type outside of the hollow region, and the third region includes the first dopant type. In a further embodiment, the first dopant type is phosphorous and the second dopant type is arsenic. Various methods may be used to form this multi-region epitaxial feature and all are encompassed by the present disclosure. First discussed is a set of embodiments where the second region is formed by introduction of the second dopant type directly to the second region. Subsequent discussion is to a set of embodiments where the second region is formed by diffusion of the second dopant type from its initial location in the first region to the second region.

Figure 7B:
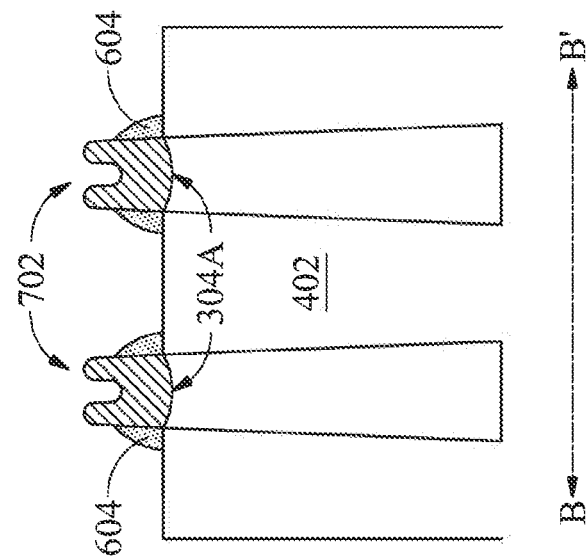
Figure 7A:
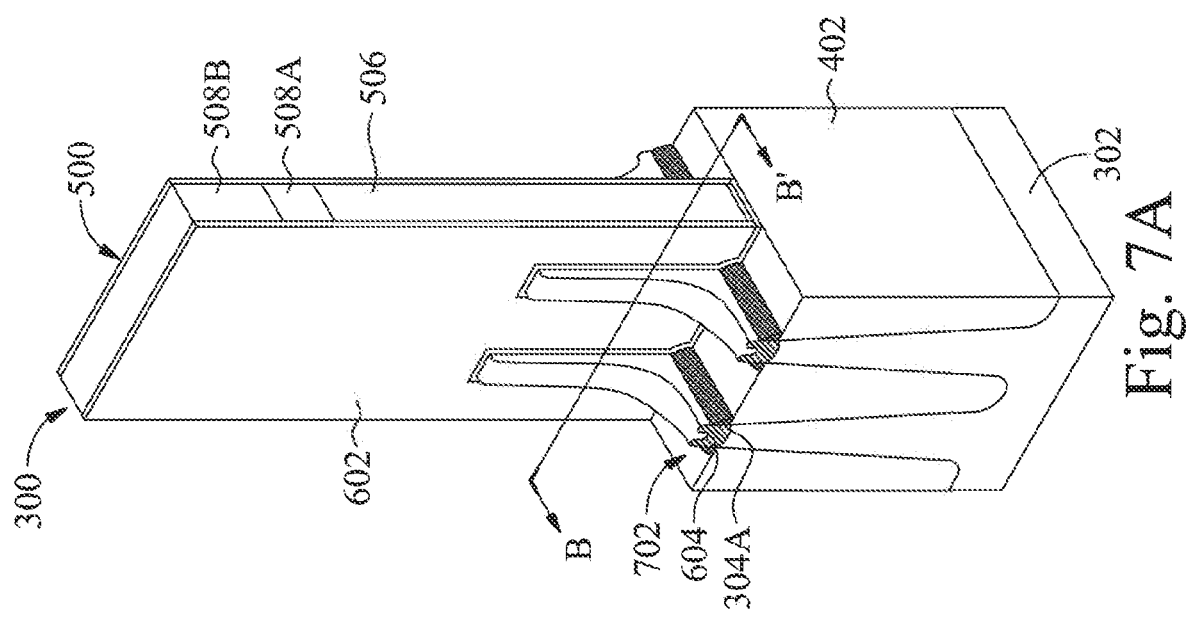

In an embodiment, the first stage of epitaxial growth in block 202 may introduce a first dopant material to form the first epitaxial portion having the first dopant material. In an embodiment, the first dopant material is phosphorous (P). In an embodiment, the first stage of epitaxial growth provides a first epitaxial portion substantially without dopants (e.g., substantially undoped silicon, for example, provided by the diffusion discussed below). In an embodiment, the first stage of epitaxial growth is performed to form a first epitaxial portion 702 as illustrated in FIGS. 7A/7B. In an embodiment, the first epitaxial portion 702 is doped silicon such as, for example silicon doped with phosphorous (P) or silicon phosphide (SiP). In some embodiments, the concentration of phosphorous is lower than that of the third epitaxial processes discussed below. In an embodiment, the concentration of phosphorous (P) includes a molar ratio of less than 2% with respect to the silicon precursor. In an embodiment, the first epitaxial portion 702 is substantially undoped silicon (Si). In another embodiment, the first epitaxial portion 702 may be silicon carbide (SiC).

A first epitaxy process to form the first epitaxial portion 702 can be implemented by CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. In an embodiment, the first epitaxial process (like blocks 206 and/or 208 below) is a VPE. In some implementations, first epitaxial portions 702 are doped during deposition by adding impurities to a source material of the epitaxy process. In some implementations, first epitaxial portions 702 are doped by an ion implantation process subsequent to a deposition process. In the depicted embodiment of FIG. 7A/7B, the first epitaxial portion 702 does not merge with epitaxial regions of the adjacent fins, however other embodiments are possible. The first epitaxial portion 702 may be approximately 1 to 10 nm in thickness.

The method 200 then proceeds to block 206 where a second region of the epitaxial feature is formed. In an embodiment, the second region is formed by a second stage of epitaxial growth. In an embodiment, the second stage of epitaxial growth may introduce a second dopant material to form the second epitaxial portion having the second dopant material. The dopant material of the second stage may be different than that of the first stage. In an embodiment, the second dopant material is arsenic (As). In a further embodiment, the first dopant material (block 204) is phosphorous (P). It is noted that while arsenic (As) is discussed herein, the present disclosure also includes use of other dopants including those similarly in column V of the periodic table such as antimony.

In some embodiments, the first dopant material of block 204 and the second dopant material of block 206 provide the same conductivity (e.g., donor/acceptor or n-type/p-type) but are different atomic materials (e.g., P and As). Referring to the example of FIGS. 8A/8B, in an embodiment, the second stage of epitaxial growth is performed to form a second epitaxial portion 802. In an embodiment, the second epitaxial portion 802 is doped silicon such as, for example silicon doped with arsenic (SiAs). The dopant concentration of the As in the second stage epitaxial region may be between ~1E20 atoms/cm$^3$ and 2E20 atoms/cm$^3$. In an embodiment, the first epitaxial portion 702 comprises SiP having a P doping concentration of about 1E20-3E20 atoms/cm$^3$; and the second epitaxial portion 802 comprises SiAs having an As doping concentration of about 1E21 to 3E21 atoms/cm$^3$. It is noted that in some methods of formation of the second epitaxial portion 802, the second epitaxial portion 802 further includes the first dopant type and the second dopant type. At least one example of this is during the diffusion of the arsenic from the first region to the second epitaxial portion formed including phosphorous. The As concentration of the second epitaxial portion 802 may be determined to provide suitable etch selectivity as discussed with reference to block 210.

The second epitaxial portion 802 is grown from a seed that includes the surface of the first epitaxial portion 702. In some implementations, second epitaxial portions 802 are doped (e.g., phosphorous and/or arsenic) during deposition by adding impurities to a source material of the epitaxy process. In some implementations, second epitaxial portions 802 are doped by an ion implantation process subsequent to a deposition process. In some implementations (see below), arsenic dopant is provided to the second epitaxial portion 802 by diffusion from the first epitaxial portion 702. In an embodiment, the second epitaxy process is implemented using a vapor-phase epitaxy (VPE) process. In an embodiment, the second epitaxial process is performed in-situ with the first epitaxial process of block 204.

In an embodiment, as depicted in FIGS. 8A/8B, the second epitaxial portion 802 merges with second epitaxial portion 802 of the adjacent fin or fins. The second epitaxial portion 802 may have a thickness of between approximately 40 to 50 nm. The thickness of the second epitaxial portion 802 is determined based on the desired size of the hollow region provided by its removal as discussed below at block 210.

In an embodiment, the size, shape and/or location of the second epitaxial portion, having the second dopant time, is tuned to determine the hollow region size, shape and location provided by the removal of the second epitaxial portion 802, as discussed below. The size, shape, and/or location of the second epitaxial portion may be determined by the dopant profile. In an embodiment, the ion implantation (e.g., after epitaxial growth) is used to selectively dope a portion of the second epitaxial layer to provide a second dopant material (e.g., As) concentration sufficient for etch selectivity to provide its removal as discussed below.

The method 200 then proceeds to block 208 where a third epitaxial region is formed. In some embodiment, the third epitaxial region is formed by a third stage of epitaxial growth. The third stage of epitaxial growth may also introduce a first dopant material to form the third epitaxial portion having the first dopant material. In an embodiment, the first dopant material is phosphorous (P). Referring to the example of FIGS. 9A/9B, in an embodiment, the third stage of epitaxial growth is performed to form a third epitaxial portion 902. In an embodiment, the third epitaxial portion 902 is doped silicon such as, for example silicon doped with phosphorous (SiP). In an embodiment, the third epitaxial portion 902 comprises SiP having a P doping concentration of about 3.8-4.2×10$^{21}$ atoms/cm$^{-3}$. In an embodiment, the third epitaxial portion 902 has a dopant concentration (P) greater than the first epitaxial portion 702.

The third epitaxial portion 902 is grown from a seed that includes the surface of the second epitaxial portion 802. The third epitaxial portion 902 is grown from all exposed surfaces of the second epitaxial portion 802, such that the third epitaxial portion 902 follows the outline of the second epitaxial portion 802. In some implementations, third epitaxial portion 902 is doped during deposition by adding impurities to a source material of the epitaxy process. In some implementations, third epitaxial portion 902 is doped by an ion implantation process subsequent to a deposition process.

In an embodiment, the third epitaxy process is implemented using a vapor-phase epitaxy (VPE) process. In an embodiment, the third epitaxial process is performed in-situ with the first and/or second epitaxial process of blocks 204 and 206.

As illustrated in exemplary figures including FIGS. 9A/9B, the method 200 may be used to form an epitaxial feature 904 that includes the first epitaxial portion 702, the second epitaxial portion 802, and the third epitaxial portion 902. Additional epitaxial layers may also be formed. The second epitaxial portion 802 has a different dopant material than that of the first and third epitaxial portions 702, 902. The second epitaxial portion 802 has a size, shape, and location provided to define the subsequent hollow region formed by its removal.

In the above description, the method 200 forms an epitaxial feature where the first epitaxial region and the third epitaxial region have a first dopant type, and the second epitaxial region has a second, different, dopant type. In some embodiments of the method 200 including as discussed above, the method 200 includes a first epitaxial stage and a third epitaxial stage that directly introduces the first dopant type and a second epitaxial stage that directly introduces at least a second dopant type (e.g., As). In alternative embodiments, the first epitaxial stage includes depositing an epitaxial material having the second dopant type, while the subsequent epitaxial stage(s) include depositing epitaxial material having the first dopant type. In doing so, diffusion of the dopants results in these alternative embodiments of the method 200 continuing to form an epitaxial feature where the first epitaxial region and the third epitaxial region have a first dopant type (or no dopant), and the second epitaxial region has a second, different, dopant type. The diffusion may be initiated by subsequent thermal processes including, for example, the high temperature of the epitaxial growth processes (e.g., second and third epitaxial stages), anneals (e.g., after epitaxial growth processes are complete), anneal of subsequent gate formation processes discussed below, and/or other thermal process. In an embodiment, while the first epitaxial stage introduces the second dopant type (e.g., As), in forming the first epitaxial portion by said processes the second dopant diffuses away from the seed area (i.e., silicon of the fin 304) such that a region of epitaxial material (e.g., silicon) substantially lacking in the second dopant is formed adjacent the fin 304 (i.e., epitaxial portion 702) and a second region of epitaxial material including the second dopant (i.e., portion 802) is formed above the substantially dopant free material. In such embodiments, again formed is an epitaxial portion 802 having a second dopant type formed over epitaxial portion 702. However, advantageously the epitaxial portions 702 and 802 may be formed in a single process. The resultant epitaxial portion 702 may be substantially silicon (without dopant, the As having diffused upward) in such an embodiment. The method 200 may continue to form the third epitaxial region (e.g., 902) including the first dopant type (e.g., phosphorous). Thus, in an embodiment, the epitaxial feature 904 includes a first epitaxial portion 702 (Si) and second epitaxial portion 802 (Si:As:P) and a third epitaxial portion 902 (Si:P). In some embodiments, phosphorous may diffuse the first epitaxial portion 702 during the subsequent thermal processes. In an embodiment, the first epitaxial process (like blocks 206 and/or 208 below) is a VPE. Like the previous embodiments, the diffusion of the dopants that will diffuse to form epitaxial portion 802 during the first epitaxial process determines the size, shape and/or location of the second epitaxial portion, having the second dopant material, and determines the hollow region size, shape and location provided by the removal of the second epitaxial portion 802 or portion thereof, as discussed below.

The method 200 then proceeds to block 210 where a clean or etching process selective to the second epitaxial portion is performed. The clean/etch process may be selective to the removal of material having the second dopant material, while leaving the material having the first dopant material substantially unetched. In an embodiment, the etching process has an etch selectivity to material of the second dopant to the first dopant of between about 1.5 to 1 and about 3 to 1. In an embodiment, the etch selectivity of Si:As to Si:P is approximately 3 to 1. In an embodiment, the etch selectivity of Si:As to Si is approximately 3 to 1. In some embodiments, the etch selectivity to the material including the second dopant is at least double that of the etch rate of the material including the first dopant. Exemplary etchants include phosphoric acid ($H_3PO_4$). In an embodiment, the etching process is a wet etch introducing a wet etchant. In an embodiment, the etching process may be performed at an elevated (greater than 25° C.) temperature to provide for suitable etch selectivity. In an embodiment, the temperature of the etching process may be between approximately 120-220 Celsius. In some embodiments, the etching temperature, etchant type, and etching time are tuned to determine the size of the hollow region. In some embodiments, residual portions of the second epitaxial portion remain after the etching process. The etch process may remove at least a portion of the second epitaxial region (e.g., including arsenic) but may retain other portions of the second epitaxial region.

Figure 10C:
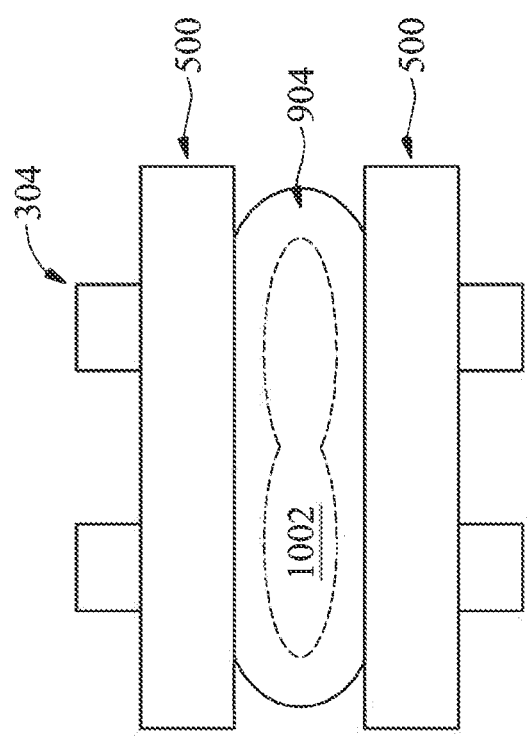
FIGS. 10C and 12C are top views, corresponding to respective isometric view listed above, of an embodiment of the device 300 according to aspects of the method of FIGS. 1 and 2.
Figure 10D:
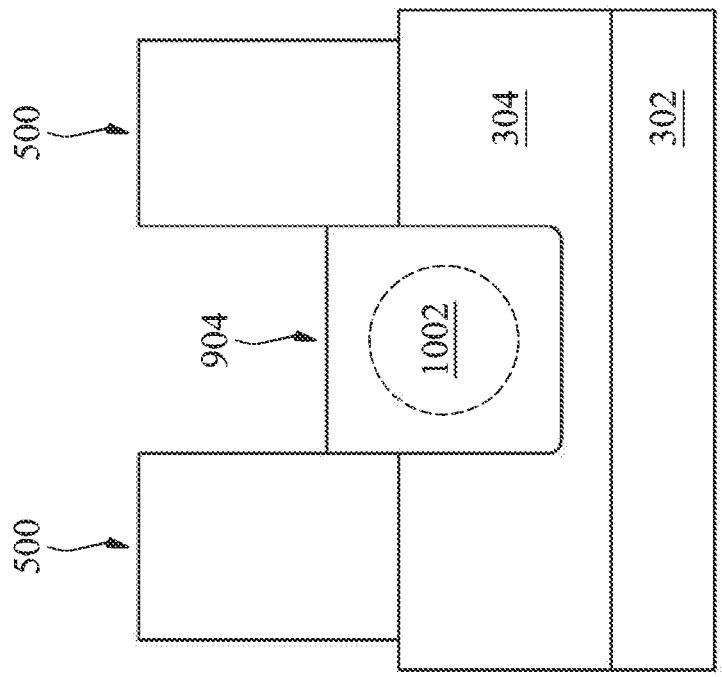

Referring to the example of FIG. 10A/10B/10C/10D, a hollow region (or void) 1002 is formed by the removal of the second epitaxial portion 802. The second epitaxial portion 802 or portion thereof may be removed by a suitable selective etching process such as a wet etch having an etch selectivity to material (second dopant material) of the second epitaxial portion 802, while substantially not etching the material of the first epitaxial portion 702 and/or the third epitaxial portion 902 (first dopant material or substantially lacking dopant material). In some embodiments, a portion of 802, illustrated as portion 802' remains on the substrate adjacent to one of first portion 702 or third portion 902 or both. In other embodiments, all of second epitaxial portion 802 is removed. In an embodiment, the residual second epitaxial portion 802' may include silicon, phosphorous dopant, and arsenic dopant.

The size of the hollow region 1002 affects the resistance of the epitaxial feature 904. The greater the size of the hollow region 1002, the greater the resistance in the source/drain of the device 300. The size of the hollow region 1002 also affects what subsequent materials may be formed therein. Thus, the trade-off between the size of the hollow region 1002 to decrease the capacitance (source/drain to gate) of the device 300 versus the source/drain resistance must be considered in determining the size. The position of the hollow region 1002 must be considered to be appropriately displaced (spaced a gap from) the channel region of the device 300 to allow for mobility from the source/drain to the channel and appropriately displaced from an upper surface of the epitaxial feature 904 to allow for a subsequently formed contact or silicide interface to the contact, to interface the epitaxial feature 904 without an undesirable additional contact resistance.

In some embodiments, portions of the second epitaxial portion 802 including those void of arsenic (i.e., diffusion may provide for less than all of the epitaxial region to include arsenic) and those including arsenic at a concentration not removed by the etchant discussed above (e.g., Si:As and/or Si:As:P) may remain in the epitaxial feature 904 after the hollow region 1002 is formed. In an embodiment, the hollow region 1002 takes up one third to one fourth of the second region 802 of the epitaxial feature.

In an embodiment, the hollow region 1002 is substantially centered between two gate structures and has a length that extends about ⅓ of the distance between the gate structures. See FIG. 12D. In an embodiment, the hollow region 1002 has a length of between approximately ¼ to just under ½ of the distance between the adjacent gate structures. In an embodiment, the hollow region 1002 has a height of between approximately 5 nm and 10 nm. In an embodiment, the hollow region 1002 has a top surface disposed between approximately 10 to 20 nm below a plane level with the top surface of the fin 304. In an embodiment, the sidewall spacers 604 extend 5 to 7 nm above the isolation structures

402. In an embodiment, the first epitaxial portion 602 extends 4 to 8 nanometers above the top of the isolation structures 402. In an embodiment, the epitaxial feature 902 has a height between approximately 52 and 56 nm. The hollow region 1002 may be approximately 5 nm to 25 nm above the sidewall spacers 604.

In an embodiment, the epitaxial feature 904 is suitably doped for a n-type FinFET device 300. In some embodiments, the first epitaxial portion 702 includes a first dopant material at a first concentration, the second epitaxial portion 802 includes a second dopant material, and the third epitaxial portion 902 includes the first dopant material at a second concentration, higher than the first concentration. The increasing dopant concentration from the first epitaxial portion in comparison with the third epitaxial portion may serve to provide the appropriate functionality to the device 300, while also reducing the resistance of the source/drain formed by the epitaxial feature 904.

Returning to the method 100 of FIG. 1, after formation of the source/drain regions in block 108, the method 100 may proceed to block 110 where a contact etch stop layer (CESL) and/or an inter-layer dielectric (ILD) layer are formed. Referring to the example of FIG. 11, in an embodiment of block 110, a CESL 1102 and an ILD layer 1104 are formed over the substrate 302. The ILD layer 1104 may be disposed over the CESL 1102. In some examples, the CESL 1102 includes a silicon nitride layer, silicon oxide layer, a silicon oxynitride layer, and/or other materials known in the art. The CESL 1102 may be formed by CVD, ALD, or other suitable process. In some embodiments, the ILD layer 1104 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1104 may be deposited by CVD, ALD, or other suitable process.

In some embodiments, the ILD layer 1104 and/or CESL 1102 can enter and fill completely or partially the hollow region 1002 of the epitaxial feature 904. In a further embodiment, some portion of the hollow region 1002 is filled with atmospheric materials (air). In an embodiment, when depositing the CESL, the CESL will be formed around the hollow profile while air is within the hollow profile. In some embodiments, the hollow region 1002 is of a dimension that the CESL is not above to be formed around the hollow profile and thus, only air is included in the hollow region 1002. Whether the hollow region 1002 is filled in whole, in part, or remains unfilled with dielectric material such as CESL, the hollow region 1002 provides a region within the source/drain feature provided by epitaxial feature 904 having dielectric properties.

In some embodiments, after formation of the ILD layer 1104, an anneal process may be performed to anneal the ILD layer 1104. In some examples, after deposition of the CESL 1102 and the ILD layer 1104, a planarization process may be performed to expose a top surface of the gate structure 500. The planarization process may include a chemical mechanical planarization (CMP) process which removes portions of the CESL 1102 and/or the ILD layer 1104 overlying the gate structure 500 and planarizes a top surface of the semiconductor device 300. The CMP process may also remove the hard mask 508 of the gate structure 500 including the oxide layer 508A and the nitride layer 508B to expose the gate electrode 506, which may include a polysilicon layer, as discussed above.

The method 100 then proceeds to block 112 where, in some embodiments, the gate structure formed in block 106 is removed for a replacement by a functional metal gate structure. In the embodiment, the dummy gate structure is removed and replaced with a metal gate electrode. In some embodiments, the gate dielectric layer and/or interfacial layers are also removed and replaced. Referring to the example of FIG. 11, in an embodiment of block 112, the dummy gate electrode portion may be removed from the substrate. The removal of the gate electrode layer 506 may be performed using a selective etching process such as a selective wet etch, a selective dry etch, or a combination thereof. In some embodiments, the gate electrode layer 506, dielectric layers 502, 504 are removed. Removal forms an opening, within which a metal gate electrode 1106 may be formed, as shown in FIG. 11, to form a final gate structure 500'.

In various examples, the metal gate electrode 1106 may include a metal, metal alloy, or metal silicide. The metal gate electrode 1106 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal gate electrode 1106 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In addition, the metal gate electrode 1106 may provide an N-type work function, may serve as a transistor (e.g., FinFET) gate electrode. In various embodiments, the metal gate electrode 1106 may be formed by ALD, PVD, CVD, e-beam evaporation, or other suitable process. Further, the metal gate electrode 1106 may be formed separately for N-FET and P-FET transistors which may use different metal layers. In various embodiments, a CMP process may be performed to remove excessive metal from the metal gate electrode 1106, and thereby provide a substantially planar top surface of the metal gate electrode 1106 and of the device 300.

The gate structure 500' may further include a gate dielectric layer 1108 and/or an interfacial layer 1110. The gate dielectric layer 1108 may be substantially similar to as discussed above with reference to gate dielectric layer 504. In some embodiments, the gate dielectric layer 1108 is a high-k dielectric material such as hafnium oxide ($HfO_2$), HfZrO, $TiO_2$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The interfacial layer 1110 may include an oxide such as silicon oxide, silicon oxynitride or other suitable material.

The method 100 may then proceed to block 114 where contact elements are formed to the source/drain features and/or the gate structure. In some embodiments, an opening is formed in the ILD layer 1104 over the epitaxial feature 904. The opening may be performed by patterning a hard mask or photoresist masking element to define the opening and etching the ILD layer 1104 through the opening. Patterning may also be implemented or replaced by other proper methods, such as maskless photolithography, electron-beam writing, ion-beam writing, and molecular imprint. The removing process to form the opening may include a plasma etch, a reaction ion etch (RIE), a dry etch, a wet etch, another proper removing process, or combinations thereof.

The semiconductor device 300 may undergo further processing to form various features and regions known in the art. For example, subsequent processing may form contacts to the source/drain and/or gate, additional interlayer dielectric (ILD) layer(s), additional contacts/vias/lines and multilayers interconnect features (e.g., metal layers and interlayer dielectrics) on the substrate 302, configured to connect the various features to form a functional circuit that may include one or more FinFET devices including FinFET device 300. In an embodiment, a conductive contact feature is formed interfacing the epitaxial feature 904, and the third epitaxial portion 902 in particular. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Turning to FIGS. 12A/12B/12C/12D, illustrated is an embodiment of an exemplary device 300'. The device 300' may be substantially similar to the device 300 discussed above. The device 300' is specifically illustrated as having a gate structure 500' that traverses a single fin 304, however other embodiments are possible. The epitaxial feature 904' of the device 300' may be substantially similar to the epitaxial feature 904 discussed above including that may be formed using the same methods as discussed above. The epitaxial feature 904' provides however for the epitaxial feature 904' to be disposed on a single fin 304, and not merge with adjacent epitaxial features 904'. As discussed above, the hollow region of the epitaxial feature 904' may be subsequently filled with ILD 1104 and/or CESL 1102 in whole or in part.

Thus, the methods 100 and 200 and the associated exemplary devices 300/300' provide in some embodiments for an improved structural configuration of the source/drain of a FinFET device and/or improvements in the performance of the device by introducing a hollow area of dielectric in the source/drain region. In some embodiments, the device performance is reduction in capacitance for the device, such as the capacitance between the source region and the gate and the capacitance between the drain region and the gate. The hollow region discussed above may be formed within both the source and within the drain of a device.

Thus, one of the embodiments of the present disclosure described a method of semiconductor device fabrication. The method includes forming a fin structure extending from a substrate. A gate structure is formed over the fin structure. An epitaxial feature is formed over the fin structure adjacent the gate structure. The forming the epitaxial feature includes growing a first epitaxial portion; forming a second epitaxial portion over the first epitaxial portion, and growing a third epitaxial portion over the second epitaxial portion. Forming the second epitaxial portion includes introducing a first dopant material and growing the third epitaxial portion includes introducing a second dopant material. A selective etching process is performed to remove at least a portion of the second epitaxial portion to form a hollow area between the first epitaxial portion and the third epitaxial portion.

In a further embodiment of the method, growing the first epitaxial portion includes introducing the first dopant material. The first dopant material may diffuse out of the first epitaxial portion to the second epitaxial portion prior to the performing the selective etching process. In a further embodiment of the method, growing the first epitaxial portion includes introducing the second dopant material. The first dopant material and the second dopant material may be n-type dopants. In an embodiment, the first dopant material is arsenic and the second dopant material is phosphorous. In an embodiment, performing the selective etching process includes introducing phosphoric acid (H3PO4).

In an embodiment, the method may further include depositing a dielectric layer over the formed epitaxial feature, wherein the dielectric layer fills at least a portion of the hollow area. In an embodiment, growing the first epitaxial portion and forming the second epitaxial portion include providing epitaxial growth including silicon.

In another of the broader methods discussed herein, a method of semiconductor device fabrication includes providing a first fin structure extending from a substrate. A gate structure is formed over the first fin structure. A seed area is provided on a surface of the first fin structure. An epitaxial feature is grown on the seed area. The growing the epitaxial feature includes introducing arsenic for a first portion of the epitaxial feature and introducing phosphorous for a second portion of the epitaxial feature. The first portion of the epitaxial feature is removed to form a hollow area within the epitaxial feature. In an embodiment, a dielectric material is formed in the hollow area. In an embodiment, after depositing the dielectric material, a contact is formed to the second portion of the epitaxial feature. In an embodiment, the dielectric material is contact etch stop layer. In an embodiment, a second fin structure is provided extending from the substrate. The growing the epitaxial feature includes the epitaxial feature extending from the first fin structure to the second fin structure. In an embodiment, removing the first portion of the epitaxial feature includes introducing a wet etchant selective to remove the first portion including arsenic.

In yet another of the embodiments, discussed is a semiconductor device is provided. The semiconductor device includes a substrate including a fin element extending from the substrate. A gate structure formed over the fin element. A source/drain feature is adjacent the gate structure and over the fin element. The source/drain feature has a lower semiconductor portion and an upper semiconductor portion. A dielectric region interposes the lower semiconductor portion and the upper semiconductor portion. In an embodiment a contact structure interfaces the upper semiconductor portion of the source/drain feature. In an embodiment, the upper semiconductor portion includes silicon and phosphorous. In an embodiment, the lower semiconductor portion includes silicon. In a further embodiment, the dielectric region includes air.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   providing a fin structure extending from a substrate;
   forming a gate structure over the fin structure;
   forming an epitaxial feature over the fin structure adjacent the gate structure, wherein the forming the epitaxial feature includes:
      growing a first epitaxial portion;
      forming a second epitaxial portion over the first epitaxial portion, wherein forming the second epitaxial portion includes introducing a first dopant material;
      growing a third epitaxial portion over the second epitaxial portion, wherein the growing the third epitaxial portion includes introducing a second dopant material; and
      performing a selective etching process to remove at least a portion of the second epitaxial portion to form a hollow area between the first epitaxial portion and the third epitaxial portion.

2. The method of claim 1, wherein the growing the first epitaxial portion includes introducing the first dopant material.

3. The method of claim 2, wherein the first dopant material diffuses out of the first epitaxial portion to the second epitaxial portion prior to the performing the selective etching process.

4. The method of claim 1, wherein the growing the first epitaxial portion includes introducing the second dopant material.

5. The method of claim 1, wherein the first dopant material and the second dopant material are n-type dopants.

6. The method of claim 1, wherein the first dopant material is arsenic and the second dopant material is phosphorous.

7. The method of claim 1, wherein the performing the selective etching process includes introducing phosphoric acid (H3PO4).

8. The method of claim 1, further comprising:
   depositing a dielectric layer over the formed epitaxial feature, wherein the dielectric layer fills at least a portion of the hollow area.

9. The method of claim 1, wherein the growing the first epitaxial portion and forming the second epitaxial portion include providing epitaxial growth including silicon.

10. A method of semiconductor device fabrication, comprising:
    providing a first fin structure extending from a substrate;
    forming a gate structure over the first fin structure;
    providing a seed area on a surface of the first fin structure;
    growing an epitaxial feature on the seed area, wherein the growing the epitaxial feature includes introducing arsenic for a first portion of the epitaxial feature and introducing phosphorous for a second portion of the epitaxial feature; and
    removing the first portion of the epitaxial feature to form a hollow area within the epitaxial feature.

11. The method of claim 10, further comprising: depositing a dielectric material in the hollow area.

12. The method of claim 11, further comprising: after depositing the dielectric material, forming a contact to the second portion of the epitaxial feature.

13. The method of claim 11, wherein the dielectric material is a contact etch stop layer.

14. The method of claim 10, further comprising: providing a second fin structure extending from the substrate, wherein the growing the epitaxial feature includes the epitaxial feature extending from the first fin structure to the second fin structure.

15. The method of claim 14, wherein the removing the first portion of the epitaxial feature includes introducing a wet etchant selective to remove the first portion including arsenic.

16. A method of fabricating a semiconductor device, the method comprising:
    providing a substrate including a fin element extending from the substrate;
    forming a gate structure over the fin element; and
    epitaxially growing a source/drain feature adjacent the gate structure and over the fin element, wherein the growing includes:
       forming the source/drain feature having a lower semiconductor portion and an upper semiconductor portion, wherein the forming the source/drain feature includes forming the upper semiconductor portion including silicon and phosphorous; and
       forming a dielectric region interposing the lower semiconductor portion and the upper semiconductor portion, wherein the forming the dielectric region includes an etching process forming a hollow area.

17. The method of claim 16, further comprising:
    forming a contact structure interfacing the upper semiconductor portion of the source/drain feature.

18. The method of claim 16, wherein the forming the source/drain feature includes forming the lower semiconductor portion including silicon.

19. The method of claim 16, wherein forming the dielectric region includes removing a middle semiconductor portion of the source/drain feature to form the hollow area, and filling the hollow area with dielectric material, wherein the middle semiconductor portion interposes the upper semiconductor portion and the lower semiconductor portion.

20. The method of claim 16, wherein forming the dielectric region includes filling the hollow area with dielectric material.

* * * * *